United States Patent
Morey et al.

(10) Patent No.: US 6,696,366 B1
(45) Date of Patent: Feb. 24, 2004

(54) TECHNIQUE FOR ETCHING A LOW CAPACITANCE DIELECTRIC LAYER

(75) Inventors: Ian J. Morey, San Jose, CA (US); Susan Ellingboe, Fremont, CA (US); Janet M. Flanner, Union City, CA (US); Christine M. Janowiak, Fremont, CA (US); John Lang, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/347,582

(22) Filed: Jun. 30, 1999

Related U.S. Application Data (63) Continuation-in-part of application No. 09/135,419, filed on Aug. 17, 1998, now Pat. No. 6,114,250.
(60) Provisional application No. 60/132,645, filed on May 5, 1999.

(51) Int. Cl.[7] .............................................. H01L 21/483
(52) U.S. Cl. ..................... 438/712; 438/700; 438/710; 438/713
(58) Field of Search ................... 438/700, 710, 438/713, 712

(56) References Cited

U.S. PATENT DOCUMENTS

| | | | |
|---|---|---|---|
| 5,122,225 A | * 6/1992 | Douglas | 156/643 |
| 5,277,750 A | * 1/1994 | Frank | 156/643 |
| 5,463,322 A | * 10/1995 | Kwasnick et al. | 324/522 |
| 5,534,751 A | 7/1996 | Lenz et al. | |
| 5,545,289 A | * 8/1996 | Chen et al. | 156/643.1 |
| 5,569,356 A | 10/1996 | Lenz et al. | |
| 5,599,747 A | * 2/1997 | Bhatt et al. | 437/209 |
| 5,627,406 A | * 5/1997 | Pace | 257/700 |
| 5,641,712 A | * 6/1997 | Grivna et al. | 438/624 |
| 5,648,296 A | * 7/1997 | Salisbury | 437/173 |
| 5,654,232 A | * 8/1997 | Gardner | 438/661 |
| 5,783,493 A | * 7/1998 | Yeh et al. | 438/718 |
| 5,843,847 A | * 12/1998 | Pu et al. | 438/723 |

FOREIGN PATENT DOCUMENTS

| | | | |
|---|---|---|---|
| JP | 01025419 | 1/1989 | H01L/21/302 |
| JP | 01059820 | 3/1989 | H01L/21/302 |
| WO | WO 96/19826 | 6/1996 | H01L/21/311 |

OTHER PUBLICATIONS

Shuzo Fujimura, etc., "Additive Nitrogen Effects on Oxygen Plasma Downstream Ashing", Japanese Journal of Applied Physics, Oct. 29, 1990, No. 10, Part 1, Tokyo, JP.
Patent Cooperation Treaty, International Search Report, dated Sep. 18, 2000.

\* cited by examiner

*Primary Examiner*—Felisa C. Hiteshew
(74) *Attorney, Agent, or Firm*—Beyer Weaver & Thomas, LLP (57) ABSTRACT

Techniques for etching through a low capacitance dielectric layer in a plasma processing chamber are disclosed. The techniques uses an etch chemistry that includes $N_2$, $O_2$, and a hydrocarbon. By etching the low capacitance dielectric layer with a plasma created out of the etch chemistry, fast etch rates can be obtained while also maintaining profile control and preserving critical dimension of the resultant opening (e.g., via/trench) being etched in the low capacitance layer.

28 Claims, 6 Drawing Sheets

TECHNIQUE FOR ETCHING A LOW CAPACITANCE DIELECTRIC LAYER

CROSS-REFERENCE TO RELATED APPLICATIONS

This application is a continuation-in-part of U.S. application Ser. No. 09/135,419, entitled "TECHNIQUES FOR ETCHING A LOW CAPACITANCE DIELECTRIC LAYER ON A SUBSTRATE", and filed on Aug. 17, 1998, now U.S. Pat. No. 6,114,250 the disclosure of which is incorporated herein by reference for all purposes. This application also claims the benefit of U.S. Provisional Application No. 60/132,645, entitled "TECHNIQUES FOR ETCHING A LOW CAPACITANCE DIELECTRIC LAYER", and filed on May 5, 1999, the disclosure of which is incorporated herein by reference for all purposes.

BACKGROUND OF THE INVENTION

The present invention relates to the fabrication of semiconductor integrated circuits (IC's). More particularly, the present invention relates to improved techniques for etching through an IC layer stack, including a low capacitance dielectric layer, during IC fabrication.

In the manufacturing of certain semiconductor integrated circuits, a low dielectric constant (low-K) material may sometimes be employed as the material in a dielectric layer in order to reduce the capacitance of devices that are formed and to improve their electrical performance. As in all dielectric layers, there is typically a need to etch vias or trenches through the dielectric layer in order to form metal interconnects therethrough. The process of forming a via/trench through the low capacitance dielectric layer is described below.

Figure 1:
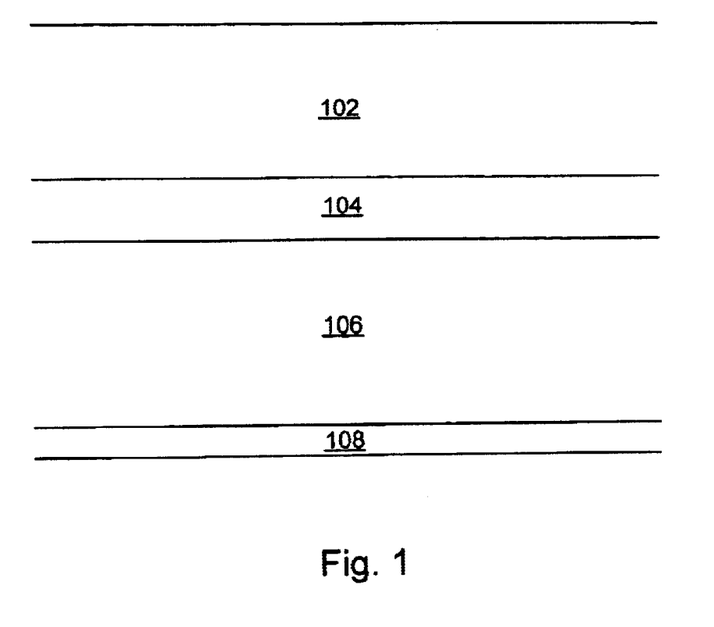
FIG. 1 illustrates an exemplary prior art IC layer stack.

To facilitate discussion, FIG. 1 illustrates a representative layer stack 100, including a photoresist layer 102, a hard mask layer 104, a low capacitance dielectric layer 106, and an etch stop layer 108. Etch stop layer 108 may represent, for example, an etch stop layer for a dual damascene process and is typically formed of a suitable etch stop material such as TiN, SiN, TEOS, or the like. Low capacitance dielectric layer 106 represents a layer of organic low-K material such as SILK by Dow Chemical, Flare by Allied Signal, BCB by Dow Chemical, Parylene by Novellus, or the like. The etch chemistry may also etch non-low-K materials such as organic films like photoresist.

Above low capacitance dielectric layer 106, there is shown disposed a hard mask layer 104, which is typically formed of a material such as SiN, SiON (silicon oxynitride) or TEOS. Hard mask layer 104 represents the masking layer that is employed to etch the via/trench in low capacitance dielectric layer 106. The hard mask layer is employed since photoresist is typically ineffective as a masking material when etching the organic low-K material of low capacitance dielectric layer 106. This is because the photoresist material and the organic low-K material tend to have similar chemical characteristics, tend to require a similar etch chemistry, and/or tend to have a similar etch rate. To pattern the hard mask out of hard mask layer 104, photoresist layer 102 is provided. Photoresist layer 102 may represent, for example, a layer of deep UV or conventional photoresist material.

Figure 2:
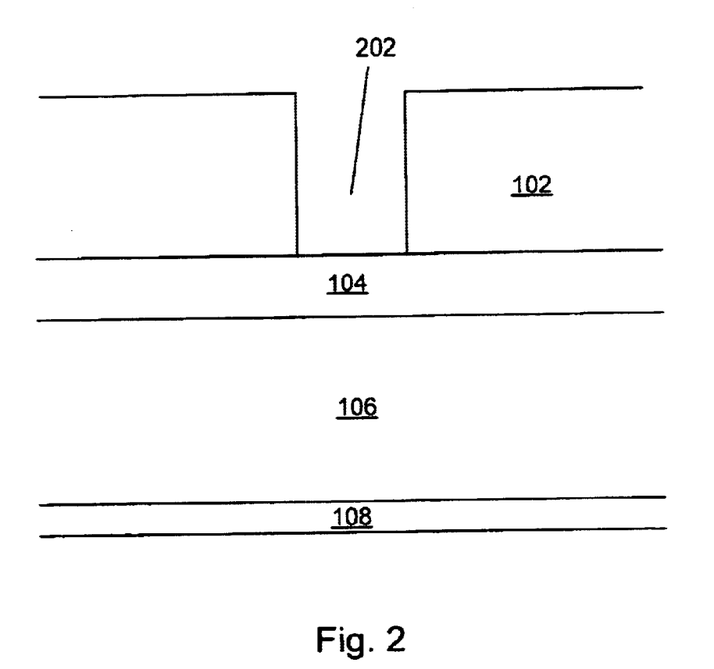
FIG. 2 illustrates the prior art IC layer stack of FIG. 1 after the photoresist layer is patterned.

In FIG. 2, photoresist layer 102 is patterned using a conventional photoresist patterning process. The patterning of photoresist layer 102 creates an opening 202 through which hard mask layer 104 may be etched in a subsequent hard mask etch process.

Figure 3:
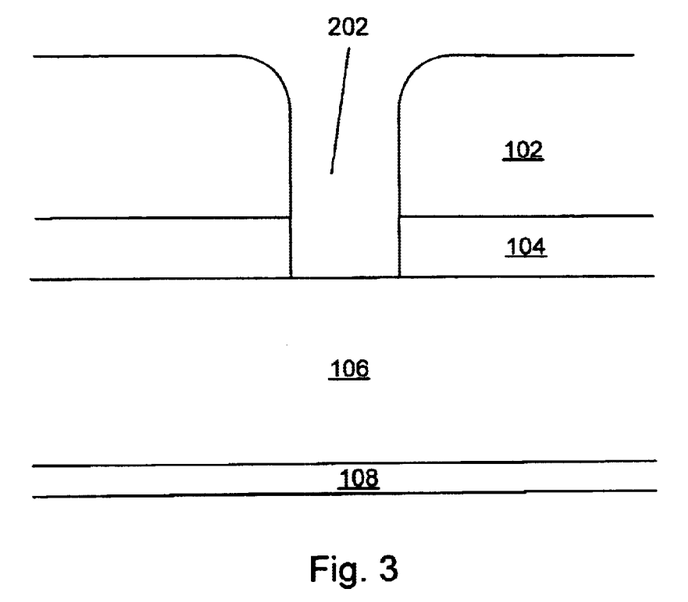
FIG. 3 illustrates the prior art IC layer stack of FIG. 1 after the hard mask layer is patterned.

In FIG. 3, a hard mask etch process is employed to extend opening 202 through hard mask layer 104. In one example, hard mask layer 104 represents a TEOS layer, and the hard mask etch process may take place in a plasma processing reactor using a suitable TEOS etch chemistry such as $Ar/C_4F_8/C_2F_6/O_2$ or a conventional TEOS etchant.

Figure 4:
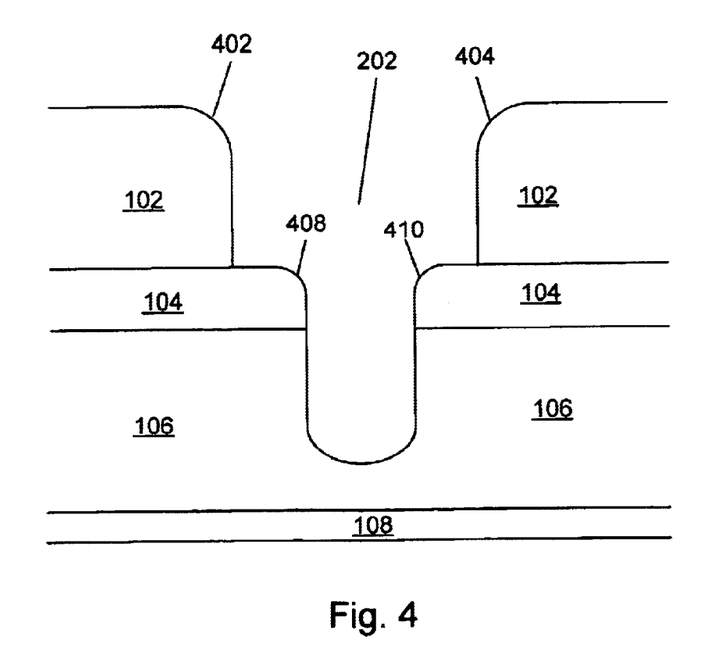
FIG. 4 illustrates the beginning of the etch through the low capacitance dielectric layer and the pull back of the photoresist which occurs.

In FIG. 4, the low capacitance dielectric layer 106 is being etched. The etching of low capacitance dielectric layer 106 typically takes place in a plasma processing reactor. Low capacitance dielectric layer 106 is typically etched using an oxygen-containing gas (such as $O_2$, $CO$, $CO_2$, or the like). A diluent such as $N_2$ is typically added to the etchant gas employed to etch through the low capacitance dielectric material. For reasons which shall be explained shortly hereinafter, a passivating agent such as a fluorocarbon gas is also typically added to the etch chemistry.

Figure 5:
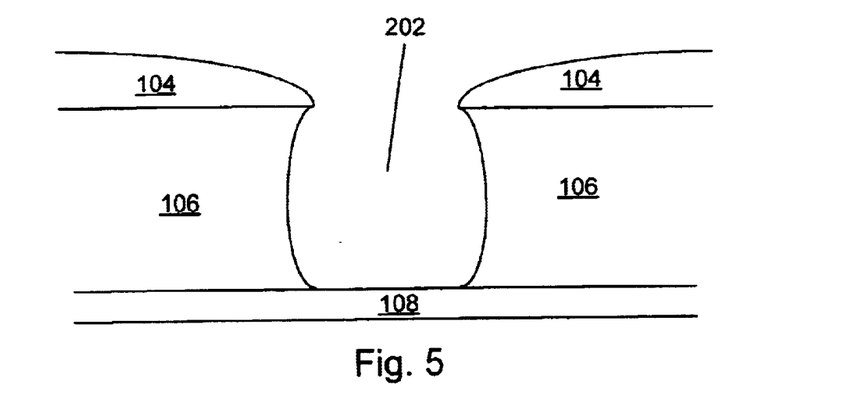
FIG. 5 illustrates the bowing that may occur in the sidewalls of the via when the prior art etch chemistry is employed to etch through the low capacitance dielectric layer.

As is well known, the oxygen species employed to etch through low capacitance dielectric layer 106 tends to etch isotropically, causing the sidewalls in opening 202 to bow instead of maintaining the desired vertical sidewall profile. FIG. 5 illustrates the bowing sidewall that occurs when the etch is allowed to proceed isotropically through low capacitance dielectric layer 106. The bowing effect is exacerbated if over-etching is required to compensate for etch nonuniformity across the wafer. This bowing effect degrades profile control, for example, causing the formation of re-entrant profiles, which are profiles that have angles greater than 90 degrees, and cause difficulties in subsequent processing steps such as metal fill.

To maintain profile control and prevent the aforementioned sidewall bowing problem, in addition to the oxygen-containing gas, the prior art typically employs a fluorocarbon such as $C_4F_8$, $C_2HF_5$, $CH_2F_2$, or the like as a passivating agent. However, while the addition of the fluorocarbon passivating agent helps preserve the vertical sidewall profile, it tends to facet first the photoresist and subsequently the hard mask, which in turn enlarges opening 202 as the etch proceeds through low capacitance dielectric layer 106.

Figure 6:
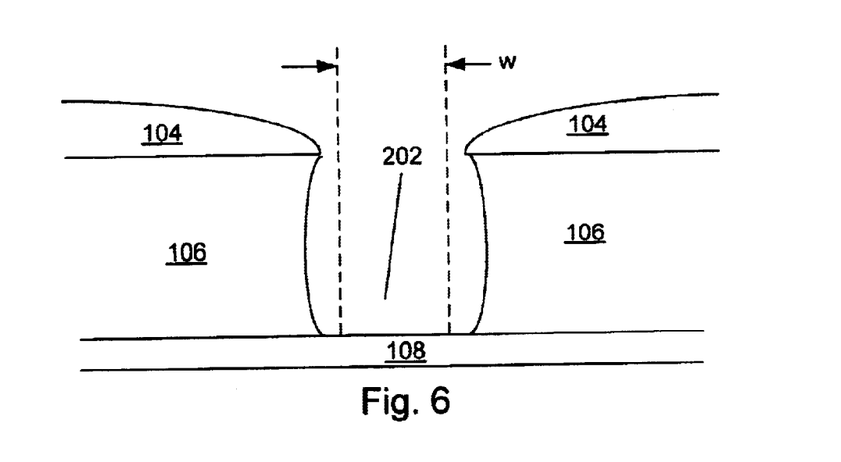
FIG. 6 illustrates the degradation of the critical dimension of the via that may occur when the prior art etch chemistry is employed to etch through the low capacitance dielectric layer.

To elaborate, the oxygen species that is employed to etch through the low capacitance dielectric layer 106 also attacks the overlying photoresist material in photoresist layer 102. Consequently, the thickness of photoresist layer 102 is reduced as the etch proceeds through low capacitance dielectric layer 106. Because the oxygen species attacks the photoresist material isotropically, the photlresist mask often pulls back in regions 402 and 404 of the via/trench. As the photoresist material is worn away by the oxygen species and the photoresist material is pulled back in regions 402 and 404 as shown in FIG. 4, the TEOS hard mask material of hard mask layer 104 is exposed to the fluorocarbon etchant that is added for passivation purposes. Since fluorocarbon is an etchant of TEOS, the exposed hard mask material in regions 408 and 410 are also etched away as time goes on, causing the opening in hard mask layer 104 to enlarge. The enlargement of the opening in hard mask layer 104 in turn enlarges the via/trench to be etched through low capacitance dielectric layer 106. With this enlargement, the critical dimension of the via/trench are lost or destroyed. The result is shown in FIG. 6 wherein the resultant via/trench has a larger cross-section than intended, where width (w) indicates the intended cross-section.

The use of a fluorocarbon additive also narrows the process window of the low capacitance dielectric layer etch. If too much fluorocarbon is added to the etch chemistry, the etch rate of the low capacitance dielectric layer will be reduced dramatically, until etch stoppage eventually occurs. If too little fluorocarbon is added, there may be insufficient passivation to maintain the desired vertical sidewall profile.

In view of the foregoing, there is a need for improved techniques for etching through a low capacitance dielectric layer while maintaining profile control, preserving critical dimension of the resultant via/trench, and maintaining a high etch rate.

SUMMARY OF THE INVENTION

The present invention relates to a method for etching through a low capacitance dielectric layer in a plasma processing chamber. The method uses an etch chemistry that includes $N_2$, $O_2$, and a hydrocarbon into the plasma processing chamber. The present invention yields not only fast etch rates but also maintains profile control and preserves critical dimension of the resultant opening (e.g., via/trench) being etched in the low capacitance layer.

In one embodiment, the present invention relates to a method for etching through a low capacitance dielectric layer in a plasma processing chamber. The low capacitance dielectric layer is disposed below a hard mask layer on a substrate. The method includes flowing an etch chemistry that includes $N_2$, $O_2$, and a hydrocarbon into the plasma processing chamber. A plasma is then created out of the etch chemistry. The method also includes etching, using the plasma, through the low capacitance dielectric layer through openings in the hard mask layer.

In accordance with another embodiment, the etch chemistry further includes a fluorocarbon-containing gas. The fluorocarbon-containing gas chemistry is, for example, effective for etching a silicon-containing low-K dielectric layer. In still another embodiment, the plasma processing chamber represents an inductive-type plasma processing chamber. In yet another embodiment, the plasma processing chamber represents a capacitive-type plasma processing chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings, which are not drawn to scale to simplify the illustration, where like reference numerals refer to similar elements, and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, a organic low capacitance dielectric material of the low capacitance dielectric layer is etched in a plasma reactor using an etch chemistry that includes hydrocarbons. In one embodiment, the etch chemistry is $N_2$, $O_2$ and $C_xH_y$. Optionally, a small amount of a fluorocarbon-containing gas may be included in the etch chemistry for use in certain applications such as etching silicon-containing low capacitance dielectric layers.

Several embodiments of an inventive $N_2/H_2$ chemistry are further described in commonly assigned U.S. patent application No. 09/135,419, filed Aug. 17, 1998 entitled, "IMPROVED TECHNIQUES FOR ETCHING A LOW CAPACITANCE DIELECTRIC LAYER ON A SUBSTRATE", which is incorporated herein by reference. The $N_2/H_2$ chemistry does achieve the desired results of good vertical profile and critical dimension (CD) control, but etches at a low etch rate. Moreover, in using the $N_2/H_2$ chemistry, if over-etching is required to compensate for etch nonuniformity across the wafer, there may be a slight bowing effect in the etched opening. The inventive $N_2/O_2/C_xH_y$—containing etch chemistry provides the desired benefits of good vertical profile and critical dimension control with a high etch rate, for example, between 2000 Å/min - 8000 Å/min, preferably between 5000 Å/min - 8000 Å/min, while avoiding the undesired characteristics of bowed sidewalls, loss of critical dimension, loss of profile control, or lower etch rate, by way of example, that are present in the etch results obtained by using alternative etch chemistries.

The inventive $N_2/O_2/C_xH_y$—containing etch chemistry may be used in etching a low capacitance dielectric layer similar to the low capacitance dielectric layer that is present in the layer stack of FIG. 1. By way of example, the etching process begins much like the partial process flow shown in FIGS. 1–4, with a layer stack that includes a photoresist layer, a hard mask layer, a low capacitance dielectric layer, and an etch stop layer. The photoresist layer is patterned by a conventional photoresist patterning process to create an opening, followed by a hard mask etch process to extend that opening through the hard mask layer. Then the low capacitance dielectric layer is etched using the inventive $N_2/O_2/C_xH_y$—containing etch chemistry.

The oxygen species that is employed to etch through the low capacitance dielectric layer also attacks the overlying photoresist layer. Consequently, the thickness of photoresist layer is reduced as the etch proceeds through the low capacitance dielectric layer. Because the oxygen species attacks the photoresist material isotropically, the photoresist mask may also pull back in regions of the via/trench, and may even be completely removed when the etching reaches the etch stop layer. This may be a desired effect in some applications which call for the removal of photoresist during etching.

In the inventive $N_2/O_2/C_xH_y$—containing etch chemistry, a hydrocarbon such as $C_2H_4$ or $CH_4$ is employed as a passivating agent. The hydrocarbon component of this inventive etch chemistry, which replaces the fluorocarbon used in prior art methods, passivates the sidewalls of the etched opening, which minimizes the isotropic component of the etch through the low capacitance dielectric layer. The use of hydrocarbons eliminates the chemical component of hard mask etching, and leaves only the physical sputtering component. Although faceting of the photoresist and subsequently the hard mask still take place, in addition to the pullback of the photoresist, the absence of fluorine in the gas chemistry used for etching the low capacitance dielectric layer greatly minimizes the faceting effects. Therefore, relatively less faceting of the photoresist and the hard mask means that adequate passivation may be provided by the hydrocarbon component of the etch chemistry to maintain the desired critical dimension and vertical sidewall profile. As a result, the cross-section of the etched opening is not enlarged and critical dimension control is achieved.

Figure 7:
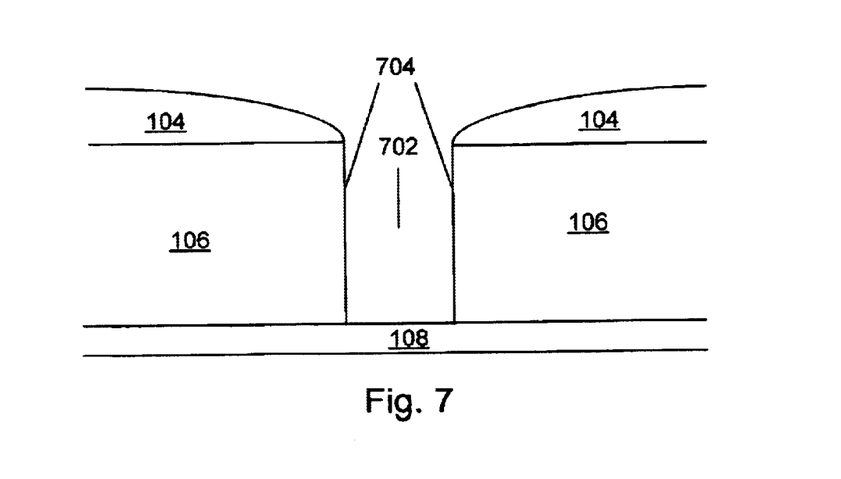
FIG. 7 illustrates an exemplar via of a low capacitance dielectric layer that is etched using one embodiment of the present invention.

FIG. 7 shows an exemplary via/trench 702 that has been etched in low capacitance dielectric layer 106 using the inventive $N_2/O_2/C_xH_y$—containing etch chemistry. Due to the passivation of the sidewalls 704 by the hydrocarbon component of the etch chemistry, a vertical profile is maintained and the desired critical dimension is achieved in spite of complete removal of the photoresist layer as well as partial erosion of hardmask 104.

Figure 8:
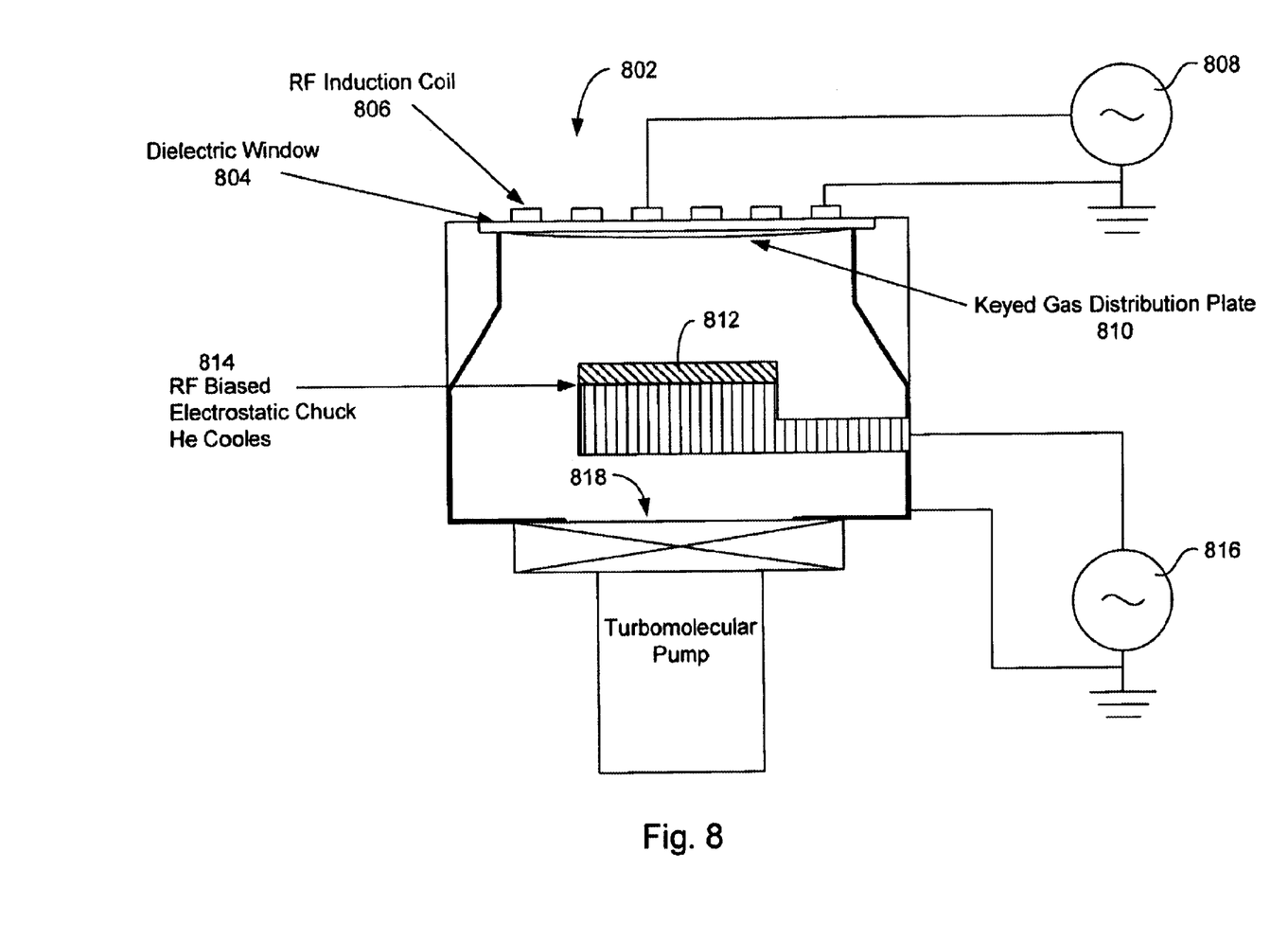
FIG. 8 illustrates a simplified schematic of the TCP™ 9100PTX plasma reactor, representing one of the plasma reactors suitable for practicing the present invention.

It is contemplated that the inventive low capacitance dielectric material etch technique may be practiced in any suitable plasma processing reactors, including capacitive-type reactors and inductive-type low pressure, high density (e.g., >$10_9$ ions/cm$^3$) reactors. In a preferred embodiment, the present invention is practiced in an inductively coupled plasma processing reactor such as the TCP™ 9100PTX plasma reactor, which is available from Lam Research Corporation. FIG. 8 illustrates a simplified schematic of the TCP™ 9100PTX plasma reactor, including a plasma processing chamber 802. A dielectric window 804 is disposed below an electrode 806 and acts as the dielectric window through which the plasma within plasma processing chamber 802 may inductively couple with electrode 806. Electrode 806 represents the RF induction source and is implemented by a coil in the example of FIG. 8. Electrode 806 is energized by a RF generator 808 via a matching network (conventional and not shown in FIG. 8 to simplify the illustration). The RF frequency of RF generator 808 may be about 13.56 MHz in one embodiment although other suitable RF frequencies may also be employed.

Within chamber 802, there may be provided a gas distribution plate 810, which preferably includes a plurality of holes for releasing gaseous source materials, e.g., the etch chemistries, into the RF-induced plasma region between gas distribution plate 810 and a wafer 812. The gaseous source materials may also be released from ports built into the walls of the chamber itself. Wafer 812 is introduced into chamber 802 and disposed on a chuck 814, which acts as a second electrode and is preferably biased by a radio frequency generator 816 (also typically via a matching network). The RF frequency of RF generator 816 may be about 4 MHz in one embodiment although other suitable RF frequencies may also be employed. Wafer 812 may be secured to chuck 814 using a conventional mechanical clamping technique or one that employs electrostatic clamping forces.

Helium cooling gas is introduced under pressure between chuck 814 and wafer 812 to act as a heat transfer medium for accurately controlling the wafer's temperature during processing to ensure uniform and repeatable etching results. During plasma etching, the pressure within chamber 802 is preferably kept low by evacuating gas through port 818, e.g., between about 1 mTorr to about 30 mTorr during the low-K dielectric etching.

Figure 9:
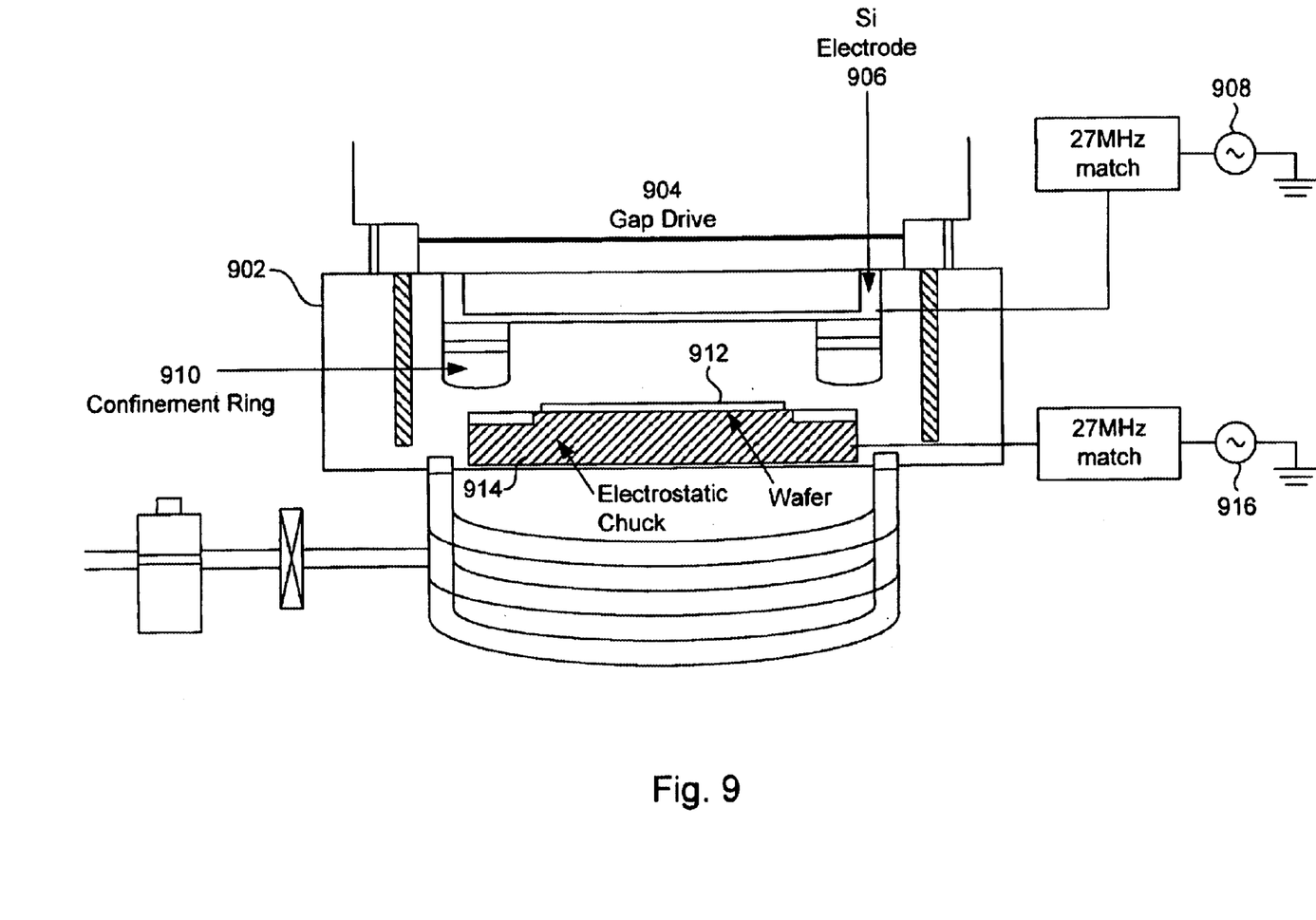
FIG. 9 illustrates a simplified schematic of the 4520 XLE plasma reactor, representing one of the plasma reactors suitable for practicing the present invention.

In another preferred embodiment, the present invention is practiced in a capactive-type plasma processing reactor such as the 4520 XLE plasma reactor, which is available from Lam Research Corporation. FIG. 9 illustrates a simplified schematic of the 4520 XLE plasma reactor, including a plasma processing chamber 902. A gap drive 904 is disposed above a top electrode 906. Gap drive 904 is primarily used for wafer transport, though it may sometimes be used as a process parameter. Top electrode 906 is implemented by a silicon electrode in the example of FIG. 9. Top electrode 906 is energized by a RF generator 908 via a matching network (conventional and not shown in FIG. 9 to simplify the illustration). The RF frequency of RF generator 908 may be about 27 MHz in one embodiment although other suitable RF frequencies may also be employed.

Within chamber 902, there may be provided a confinement ring 910, which preferably confines the plasma generated in the gaseous source materials, e.g., the etch chemistries, into the RF-induced plasma region between top electrode 906 and a wafer 912. Gases enter chamber 902 through top electrode 906. The gaseous source materials may also be released from ports that may be built into the walls of the chamber itself or released around the perimeter of the electrostatic chuck 914. Wafer 912 is introduced into chamber 902 and disposed on a chuck 914, which acts as a second electrode and is preferably biased by a RF generator 916 (also typically via a matching network). The RF frequency of RF generator 916 may be about 2 MHz in one embodiment although other suitable RF frequencies may also be employed. Wafer 912 may be secured to chuck 914 using a conventional mechanical clamping technique or one that employs electrostatic clamping forces. During plasma etching, the pressure within chamber 902 is typically kept between about 10 mTorr to about 300 mTorr during the low-K dielectric etching.

Figure 10:
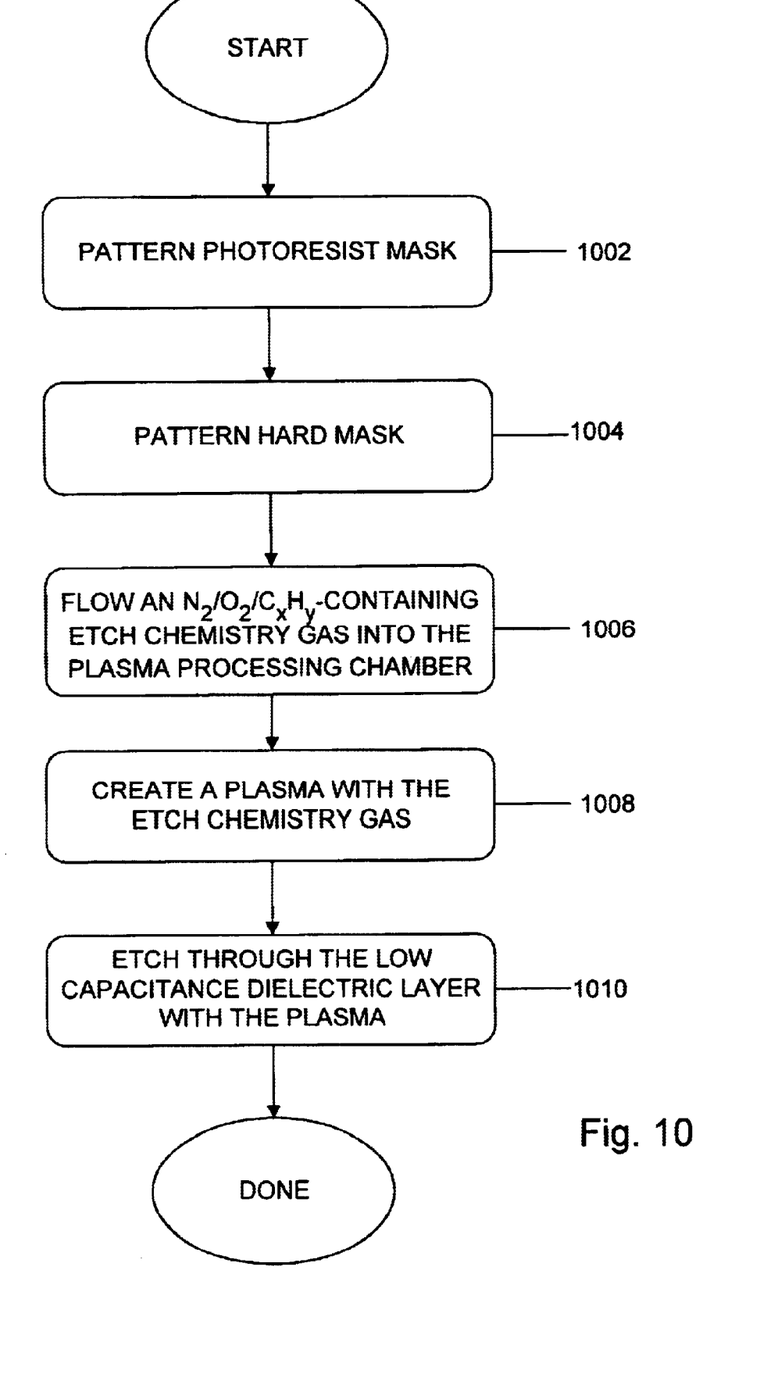
FIG. 10 illustrates, in accordance with one embodiment of the present invention, a flowchart of the operations of the inventive low capacitance dielectric etch.

FIG. 10 illustrates a flowchart of the operations of the inventive low capacitance dielectric etch process 1000 in accordance with one embodiment of the present invention. In operation 1002, a photoresist mask is patterned using a conventional photoresist patterning process. In operation 1004, a hard mask is patterned out of a hard mask layer using the earlier created photoresist mask. That is, openings in the hard mask that correspond to the openings to be formed in the low capacitance dielectric layer are etched in operation 1004. As the term is used herein, the openings in the low capacitance dielectric layer refer to features etched in the low capacitance dielectric layer and include both trenches and vias.

In operations 1006, 1008, and 1010, the low capacitance dielectric layer is etched. The etching of the low capacitance dielectric layer may take place in a separate plasma processing chamber, or more preferably, in the same plasma processing chamber that is employed for the hard mask etch. In operation 1006, an $N_2/O_2/C_xH_y$—containing etch chemistry is flowed into the plasma processing chamber. The $N_2/O_2/C_xH_y$—containing etch chemistry may optionally include a fluorocarbon, such as $C_2F_6$ or $C_4F_8$, which would be desirable in etching a low capacitance dielectric layer that contains silicon such as a benzo-cyclo-butene (BCB) material. In operation 1008, a plasma is created out of the $N_2/O_2/C_xH_y$—containing etch chemistry. In operation 1010, the plasma that is created out of the $N_2/O_2/C_xH_y$—containing etch chemistry is allowed to etch through the low capacitance dielectric material of the low capacitance dielectric layer through the openings in the hard mask. After the low capacitance dielectric layer is etched through at operation 1010, the low capacitance dielectric etch process 1000 ends. In most cases, however, an overetch step may be employed to compensate for any etch nonuniformity across the wafer. Thereafter, conventional processing operations may be employed to form integrated circuits from the etched wafer.

In one example, the wafer to be etched represents a 200 mm wafer having thereon a layer of the low capacitance dielectric material FLARE 2.0 underlying a hard mask layer formed of TEOS. The low capacitance dielectric layer is about 7,500 angstroms thick, and the hard mask layer is about 2,000 angstroms thick. The photoresist mask represents a deep UV photoresist mask, although any type of photoresist material may be employed. The openings to be etched have a cross-section of about 0.3 microns. The low capacitance dielectric layer etch is performed in a high density, low pressure inductively coupled plasma processing reactor known as the TCP™ 9100PTX, available from Lam Research Corp. of Fremont, Calif. It should be readily apparent and within the skills of one skilled in the art that the parameters provided in the examples below may be scaled and/or modified as appropriate to etch a substrate having a different dimension or to conform to the requirements of a specific plasma reactor.

In the aforementioned TCP™ 9100 PTX plasma processing system, the pressure within the plasma processing chamber may be between about 1 milliTorr (mT) and about 30 mT, more preferably between about 5 mT and about 20 mT, and preferably at about 10 mT. The top electrode power may be between about 700 watts and about 2,200 watts, more preferably between about 1200 watts and about 2000 watts, and preferably at about 1,800 watts. The bottom electrode power may be between about 50 watts and about 500 watts, more preferably between about 100 watts and about 400 watts, and preferably at about 300 watts.

In the TCP™ 9100 PTX plasma processing system used in this example, the $N_2$ flow may be between about 25 sccm and about 150 sccm, more preferably between about 50 sccm and about 100 sccm, and preferably at about 50 sccm. The $O_2$ flow may be between about 5 sccm and about 75 sccm, more preferably between about 10 sccm and about 50 sccm, and preferably at about 25 sccm. The $C_xH_y$ flow may be between about 1 sccm and about 50 sccm, more preferably between about 5 sccm and about 30 sccm, and preferably at about 15 sccm. Small amounts (e.g., <5 sccm) of a fluorocarbon-containing gas may also be added to the $N_2/O_2/C_xH_y$—containing etch chemistry such as when etching a silicon-containing low capacitance dielectric layer such as BCB. By way of example, $C_2F_6$ or $C_4F_8$ may be added.

The low capacitance dielectric layer etch can also be performed in a capacitive-type plasma processing reactor such as the 4520XLE, available from Lam Research Corp. of Fremont, Calif. In the aforementioned 4520XLE plasma processing system, the pressure within the plasma processing chamber may be between about 10 milliTorr (mT) and about 300 mT, more preferably between about 30 mT and about 200 mT, and preferably at about 100 mT. The top electrode power may be between about 0 watts and about 2,000 watts, more preferably between about 200 watts and about 800 watts, and preferably at about 500 watts. The bottom electrode power may be between about 0 watts and about 2000 watts, more preferably between about 200 watts and about 800 watts, and preferably at about 500 watts.

In the 4520XLE plasma processing system, the $N_2$ flow may be between about 0 sccm and about 1000 sccm, more preferably between about 50 sccm and about 600 sccm, and preferably at about 500 sccm. The $O_2$ flow may be between about 5 sccm and about 500 sccm, more preferably between about 5 sccm and about 50 sccm, and preferably at about 18 sccm. The $C_xH_y$ flow may be between about 0 sccm and about 500 sccm, more preferably between about 0 sccm and about 50 sccm, and preferably at about 18 sccm. Small amounts (e.g., <5 sccm) of a fluorocarbon-containing gas, $C_2F_6$ or $C_4F_8$, by way of example, may also be added to the $N_2/O_2/C_xH_y$—containing etch chemistry when etching a silicon-containing low capacitance dielectric layer such as BCB.

The percentage flow of $N_2$ expressed as a percentage of total flow may be between about 50% and about 95%, and in an exemplar etch process, at about 93.3%. The percentage flow of $O_2$ expressed as a percentage of total flow may be between about 2% and about 40%, and in an exemplar etch process, at about 3.3%. The percentage flow of $C_xH_y$ expressed as a percentage of total flow may be between about 2% and about 40%, and in an exemplar etch process, at about 3.3%. As mentioned before, additional fluorocarbon-containing gases may also be added to the $N_2/O_2/C_xH_y$—containing etch chemistry such as when etching a silicon-containing low capacitance dielectric layer (e.g., BCB). By way of example, $C_2F_6$ or $C_4F_8$ may be added, and the percentage flow of $C_xF_y$ expressed as a percentage of total flow may be, by way of example, about 0.05%.

It is believed that increasing the hydrocarbon content relative to the oxygen in the etch chemistry contributes more to improving profile control than merely changing the oxygen flow. The $C_xH_y:O_2$ ratio may be between about 1:99 to about 2:1, more preferably between about 2:3 and about 3:2. In one exemplary etch, advantageous etch results were observed in an etch chemistry mixture having a $C_xH_y:O_2$ ratio of about 3:2.

As can be appreciated from the foregoing, the inventive low capacitance dielectric etch that employs an $N_2/O_2/C_xH_y$—containing etch chemistry advantageously passivates the sidewalls to maintain a substantially vertical profile and to facilitate a higher degree of critical dimension control even while etching at high etch rates. The passivation of the sidewalls, which is due to the hydrocarbon component of the improved $N_2/O_2/C_xH_y$—containing etch chemistry, allows the etched opening to maintain the substantially vertical profile as well as to facilitate a higher degree of critical dimension control. The hydrocarbon addition to the inventive etch chemistry compensates for the isotropic etch qualities of the oxygen-containing component.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching in a plasma processing chamber, said method comprising:
    providing a substrate which includes thereon a low capacitance dielectric layer disposed below a hard mask layer, the low capacitance dielectric layer being formed of a low-K material;
    flowing an etch chemistry that includes $N_2, O_2$, and a hydrocarbon into said plasma processing chamber;
    creating a plasma out of said etch chemistry, wherein the plasma comprises an oxygen species;
    etching said low capacitance dielectric layer through openings in said hard mask layer, wherein said etching is accomplished using the oxygen species.

2. The method of claim 1, wherein said hydrocarbon is $C_2H_4$.

3. The method of claim 1, wherein said hard mask layer is formed of TEOS.

4. The method of claim 1, wherein said plasma processing chamber represents a low pressure, high density plasma processing chamber.

5. The method of claim 1, wherein said plasma processing chamber represents an inductively coupled plasma processing chamber.

6. The method of claim 1, wherein the percentage of flow of said $N_2$ is between about 50% and about 95% of a total flow.

7. The method of claim 6, wherein the percentage of flow of said $O_2$ is between about 5% and about 40% of a total flow.

8. The method of claim 7, wherein the percentage of flow of said hydrocarbon is between about 2% and about 40% of a total flow rate.

9. The method of claim 1, wherein said hardmask layer is a material from a group including SiN and SiON.

10. The method of claim 1, wherein said hard mask layer is disposed below a photoresist layer.

11. A method as in claim 1, wherein the hydrocarbon of the etch chemistry consists of a non —$CH_4$ hydrocarbons.

12. A method for etching a low capacitance dielectric layer in a plasma processing chamber, said low capacitance dielectric layer being disposed below a hard mask layer on a substrate, said method comprising:
    etching said hard mask layer to form openings in said hard mark layer;
    flowing an etch chemistry that includes $O_2$ and a hydrocarbon into said plasma processing chamber;
    creating a plasma out of said etch chemistry; and
    etching, using said plasma, through said low capacitance dielectric layer through said openings in said hard mask layer, said etch chemistry passivating sidewalls of said openings during said etching of said low capacitance dielectric layer to allow substantially vertical profiles.

13. The method of claim 12, wherein said etch chemistry further includes $N_2$.

14. The method in claim 12, wherein etching said hard mask layer and etching said low capacitance dielectric layer are performed in a single processing chamber.

15. The method of claim 12, wherein the low capacitance dielectric layer is formed of an organic material.

16. A method for etching a low capacitance dielectric layer in a plasma processing chamber, said low capacitance dielectric layer being disposed below a hard mask layer on a substrate, said hard mask disposed below a photoresist mask, said method comprising:
    patterning an opening in said photoresist mask;
    patterning said hard mask layer of a material from a group including SiN, SiON, and TEOS using said opening in said photoresist mask;
    flowing an etch chemistry that includes $N_2, O_2$, and a hydrocarbon into said plasma processing chamber;
    creating a plasma out of said etch chemistry; and
    etching, using said plasma, through said low capacitance dielectric layer through said openings in said hard mask layer.

17. The method of claim 16, wherein said photoresist mask is removed during etching.

18. The method of claim 16, wherein said etch chemistry further includes a fluorocarbon.

19. The method of claim 16, wherein said photoresist mask is removed prior to etching.

20. The method of claim 16, wherein said plasma processing chamber represents one of an inductively coupled plasma processing chamber and a capacitance plasma processing chamber.

21. The method of claim 16, wherein said hydrocarbon and said $O_2$ are present in the etch chemistry at a ratio of between about 2:1 and about 1:99.

22. A method for plasma etching a layer of organic material in a plasma processing chamber, the method comprising:
    providing a substrate which includes thereon the layer of organic material which is disposed below a hard mask, the hard mask layer having a pattern of openings therein;
    flowing an etch chemistry that includes $N_2, O_2$, and a hydrocarbon into the plasma processing chamber;
    creating a plasma out of the etch chemistry; and
    etching the layer of organic material, using the plasma, through the pattern of openings in the hard mask layer.

23. The method of claim 22, wherein the hard mask layer is formed of TEOS.

24. The method of claim 22, wherein the layer of organic material comprises a low-K dielectric material.

25. The method of claim 22, wherein the etching of the layer of organic material, through the pattern of openings in the hard mask layer, is such that the $O_2$ of the etch chemistry etches the layer of organic material and the hydrocarbon of the etch chemistry passivates sidewalls of said openings during the etching to allow substantially vertical profiles.

26. A method for etching in a plasma processing chamber, said method comprising:
    providing a substrate which includes thereon a low capacitance dielectric layer;
    flowing an etch chemistry that includes $O_2$, and a hydrocarbon into said plasma processing chamber;
    creating a plasma out of said etch chemistry, wherein the plasma includes an oxygen species;
    etching said low capacitance dielectric layer using the oxygen species.

27. The method of claim 26, wherein the hydrocarbon is $C_2H_4$.

28. The method of claim 27, wherein the etch chemistry further includes $N_2$.

* * * * *

UNITED STATES PATENT AND TRADEMARK OFFICE
CERTIFICATE OF CORRECTION

PATENT NO. : 6,696,366 B1
DATED : February 24, 2004
INVENTOR(S) : Morey et al.

It is certified that error appears in the above-identified patent and that said Letters Patent is hereby corrected as shown below:

<u>Title page,</u>
Item [54], should read -- TECHNIQUES FOR ETCHING A LOW CAPACITANCE DIELECTRIC LAYER --

Signed and Sealed this

Tenth Day of August, 2004

JON W. DUDAS
*Acting Director of the United States Patent and Trademark Office*